(12) United States Patent
Ragaini et al.

(10) Patent No.: US 11,451,042 B2
(45) Date of Patent: Sep. 20, 2022

(54) METHOD FOR IDENTIFYING A FAULT EVENT IN AN ELECTRIC POWER DISTRIBUTION GRID SECTOR

(71) Applicant: ABB S.p.A., Milan (IT)

(72) Inventors: Enrico Ragaini, Bergamo (IT); Daniele Angelosante, Turgi (CH); Lorenzo Fagiano, Zürich (CH)

(73) Assignee: ABB S.PA., Milan (IT)

( * ) Notice: Subject to any disclaimer, the term of this patent is extended or adjusted under 35 U.S.C. 154(b) by 1031 days.

(21) Appl. No.: 15/961,180

(22) Filed: Apr. 24, 2018

(65) Prior Publication Data

US 2018/0316176 A1 Nov. 1, 2018

(30) Foreign Application Priority Data

Apr. 26, 2017 (EP) .................................... 17168236

(51) Int. Cl.
| | |
|---|---|
| *H02H 1/00* | (2006.01) |
| *G01R 19/165* | (2006.01) |
| *G01R 31/08* | (2020.01) |
| *H02H 3/08* | (2006.01) |
| *H02H 7/26* | (2006.01) |
| *H02H 1/04* | (2006.01) |

(52) U.S. Cl.
CPC ..... *H02H 1/0092* (2013.01); *G01R 19/16528* (2013.01); *G01R 31/086* (2013.01); *H02H 1/043* (2013.01); *H02H 3/083* (2013.01); *H02H 7/26* (2013.01)

(58) Field of Classification Search
CPC ............ G01R 31/086; G01R 19/16528; H02H 1/0092; H02H 1/043; H02H 3/083; H02H 7/26
See application file for complete search history.

(56) References Cited

U.S. PATENT DOCUMENTS

| | | | |
|---|---|---|---|
| 4,745,512 A | 5/1988 | Hampson | |
| 5,537,327 A * | 7/1996 | Snow ..................... | G01R 31/58 700/293 |
| 6,718,271 B1 * | 4/2004 | Tobin ..................... | G01R 31/50 702/58 |
| 7,391,218 B2 * | 6/2008 | Kojori .................. | H02H 1/0015 324/520 |
| 8,260,579 B2 * | 9/2012 | Bickel ............... | H02J 13/00006 702/188 |
| 8,336,352 B2 | 12/2012 | Abiprojo et al. | |
| 9,152,737 B1 * | 10/2015 | Micali ..................... | H02J 13/00 |
| 9,798,342 B2 * | 10/2017 | Gubba Ravikumar ...................... | G05F 1/625 |

(Continued)

OTHER PUBLICATIONS

European Patent Office, Extended Search Report issued in corresponding Application No. 17168236.2, dated Nov. 10, 2017, 9 pp.

*Primary Examiner* — Raymond L Nimox
(74) *Attorney, Agent, or Firm* — Greenberg Traurig, LLP

(57) ABSTRACT

A method for identifying a fault event in an electric power distribution grid sector including one or more electric loads and having a coupling node with a main grid, at which a grid current adsorbed by said electric loads is detectable. The method allows determining whether a detected anomalous variation of the grid current, adsorbed at the electric coupling node, is due to the start of a characteristic transitional operating period of an electric load or is due to an electric fault.

17 Claims, 10 Drawing Sheets

(56) References Cited

U.S. PATENT DOCUMENTS

Figure 1:
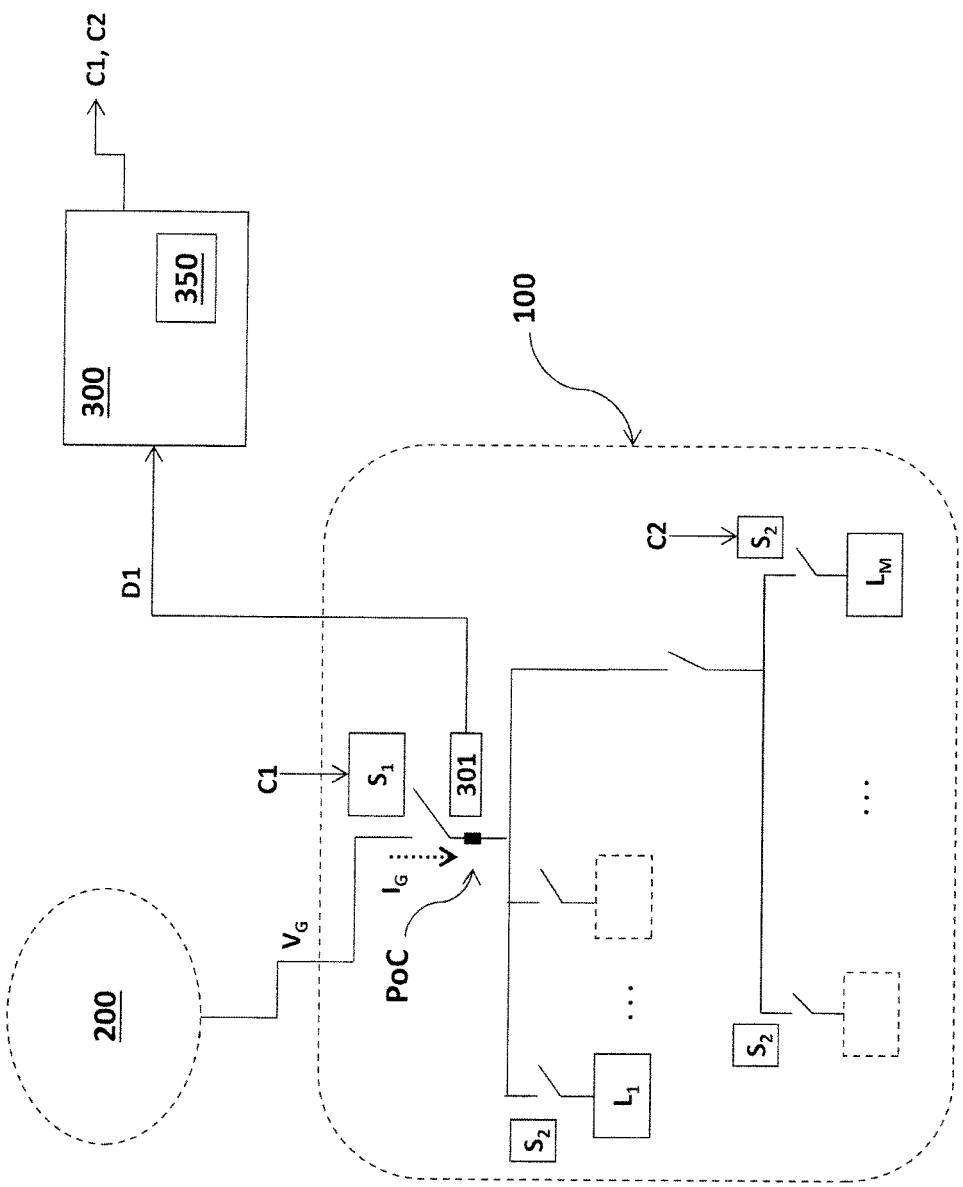

| | | | |
|---|---|---|---|
| 2011/0082654 A1* | 4/2011 | Dickens | H02J 3/242 |
| | | | 702/188 |
| 2011/0221369 A1* | 9/2011 | Welchko | H02P 29/0241 |
| | | | 318/400.22 |
| 2012/0004867 A1* | 1/2012 | Mousavi | G01R 31/3274 |
| | | | 702/58 |
| 2013/0221977 A1* | 8/2013 | Ukil | H02H 3/081 |
| | | | 324/522 |
| 2014/0100705 A1* | 4/2014 | Shi | H02J 3/381 |
| | | | 700/293 |
| 2015/0204918 A1* | 7/2015 | Chen | G01R 25/00 |
| | | | 702/64 |
| 2015/0349511 A1* | 12/2015 | Kojovic | H02H 3/28 |
| | | | 361/36 |
| 2018/0026446 A1* | 1/2018 | Gonzalez Espin | H02J 9/062 |
| | | | 307/23 |
| 2019/0393695 A1* | 12/2019 | Belli | H02H 7/20 |

* cited by examiner

METHOD FOR IDENTIFYING A FAULT EVENT IN AN ELECTRIC POWER DISTRIBUTION GRID SECTOR

The present invention relates to the field of electric power distribution grids. More particularly, the present invention relates to a method for identifying a fault event in an electric power distribution grid sector.

As it is known, modern electric power distribution grids are commonly equipped with electronic protection devices (also known as "protection relays") designed to enable specific grid sectors to properly operate by selectively managing the electrical connection of said grid sectors with a main grid.

An electronic protection device is normally mounted on-board or operatively associated with a switching device (e.g. a circuit breaker) capable of electrically connecting or disconnecting a grid sector with or from the main grid.

Typically, an electronic protection device is adapted to receive detection signals indicative of electric quantities of the grid sector, process the detection data so received and, when necessary (e.g. in the event of failures or overloads), generate suitable control signals to prompt the intervention of the switching device operatively associated therewith.

Electronic protection devices currently available in the state of the art show some limits in managing operation of grid sectors including a large numbers of electric loads, particularly when said electric loads are designed in such a way to absorb high currents during specific transitional periods of their operating life (e.g. during the start-up phase when said electric loads are electric rotating machines).

In most of the cases, in fact, these devices are configured to cause the intervention of the associated switching device if the values of current absorbed at a given electric node of the grid sector overcome a predefined threshold regardless of the actual causes at the origin of the detected abnormal current absorption.

This may lead to undesired network disconnections as a detected current absorption peak is not necessarily caused by an electric fault but it may be merely due to a transitional operating condition of an electric load of the grid sector (for example the start-up of an electric rotating machine). Obviously, such undesired network disconnections may have a relevant impact on the overall operating costs of the grid sector.

In order to mitigate these problems, sophisticated configuration procedures have been developed to properly tune the protection parameters of the electronic protection devices during the commissioning phase of these latter.

However, these solutions are quite time consuming and expensive to carry out as they entail extensive laboratory and on-field tests.

In the market, there is a large demand for solutions ensuring a robust and effective management of the operation of grid sectors, particularly when these latter include electric loads absorbing high currents during specific transitional periods of their operational life.

In order to respond to this need, the present invention provides a method for identifying a fault event in an electric power distribution grid sector, according to the following claim 1 and the related dependent claims.

In a further aspect, the present invention relates to a computer program, according to the following claim 11.

In a further aspect, the present invention relates to a computerised device, according to the following claim 12.

Characteristics and advantages of the present invention shall emerge more clearly from the description of preferred but not exclusive embodiments illustrated purely by way of example and without limitation in the attached drawings, in which:

FIG. 1 schematically illustrates a grid sector of an electric power distribution grid;

FIGS. 2-10 are diagrams schematically illustrating the method, according to the invention.

With reference to the mentioned figures, the present invention relates to a method 1 for identifying a fault event in an electric power distribution grid sector 100.

The grid sector 100 may be a smart grid, a micro-grid or, more in general, any portion of an electric power distribution grid.

As an example, the grid sector 100 may be an electric power distribution network for industrial, commercial or residential buildings or plants.

In general, the grid sector 100 may operate at low or medium voltage levels.

Within the framework of the present invention, the term "low voltage" relates to operational voltages up to 1.2 kV AC and 1.5 kV DC whereas the term "medium voltage" relates to operational voltages higher than 1.2 kV AC and 1.5 kV DC up to several tens of kV, e.g. up to 72 kV AC and 100 kV DC.

Preferably, the grid sector 100 comprises an electric coupling node PoC (Point of Coupling), at which it is electrically connectable with or disconnectable from main grid 200, which may be, for example, an electric power utility grid.

The grid sector 100 may have electric lines with one or more of electric phases, e.g. with three electric phases.

Preferably, at the coupling node PoC, the grid sector 100 comprises a first switching device $S_1$, the operation of which can be selectively controlled by means of suitable control signals C1.

When the switching device $S_1$ is in a closed (ON) state or in an open (OFF) state, the grid sector 100 is electrically connected to or disconnected from the main grid 200, respectively.

The switching device $S_1$ may be of known type (e.g. a circuit breaker, a disconnector, a contactor, or the like) and will not here further described for the sake of brevity.

Conveniently, the overall grid current $I_G$ absorbed by the grid sector 100 (i.e. of the electric loads thereof) can be detected at the electric coupling node PoC by suitable detection means 301.

The grid sector 100 comprises one or more electric loads $L_1, \ldots, L_M$, each of which consumes a corresponding amount of electric power provided by the electric power source 200.

In general, the electric loads $L_1, \ldots, L_M$ may be of any type, according to the needs.

Preferably, the electric loads $L_1, \ldots, L_M$ are formed by corresponding electric rotating machines, e.g. by corresponding three-phase induction motors.

The electric loads $L_1, \ldots, L_M$ may be of known type and will not here further described for the sake of brevity.

Conveniently, the grid sector 100 comprises one or more second switching devices $S_2$ for electrically disconnecting or connecting one or more electric loads $L_1, \ldots, L_M$ from or with the remaining portions of the grid sector.

The operation of each switching device $S_2$ can be controlled in a known manner by means of suitable control signals C2.

The switching devices $S_2$ may be of known type (e.g. circuit breakers, disconnectors, contactors, I-O interfaces, switches, switch-disconnectors or the like) and will not here further described for the sake of brevity.

As mentioned above, the method 1, according to the invention, is directed to allow identification of a fault event in the grid sector 100. More particularly, the method 1 is directed to determine whether a detected anomalous variation of the grid current $I_G$ is due to the occurrence of a characteristic transitional operating period of an electric load $L_1, \ldots, L_M$ or is due to an electric fault.

The method 1 is particularly suitable for the identification of a fault event in a grid sector 100 including electric rotating machines as electric loads $L_1, \ldots, L_M$.

In this case, the method 1 allows determining whether a detected anomalous variation of the grid current $I_G$ is due to the start-up of an electric rotating machine $L_1, \ldots, L_M$ or is due to an electric fault.

In the following, the method 1 will be described with particular reference of this implementation for the sake of clarity, without intending to limit the scope of the invention.

In principle, in fact, the method 1 may be implemented in a grid sector 100 including different types of electric loads and may be referred to different characteristic transitional operating periods for said electric loads, depending on the actual nature of these latter.

Referring to the cited figures, the method 1, according to the invention, comprises a step (a) of acquiring, for each electric phase, first data values $i_k(n)$ indicative of the grid current $I_G$ flowing at the coupling node PoC.

The first data values $i_k(n)$ are acquired at subsequent sampling instants n, each of which is a multiple of a given sampling period Ts. In practice, n is a natural number.

Preferably, the first data values $i_k(n)$ are obtained by sampling first detection signals D1 with a given sampling frequency Fs=1/Ts. Typical values for the sampling frequency Fs and the sampling period Ts may be, for example, Fs=10 kHz and Ts=100 µs.

In a practical implementation of the method 1, the grid current $I_G$ may be detected by first sensor means 301 arranged at the coupling node PoC and providing the first detection signals D1 indicative of the grid current $I_G$.

The sensor means 301 may be of known type (e.g. current transformers, Rogowski coils, Hall sensors or the like) and will not here further described for the sake of brevity.

Conveniently, additional data values $v_k(n)$ indicative of a grid voltage $V_G$ at the coupling node PoC may be acquired, for each electric phase, at the same sampling instants n or at time intervals including a plurality of sampling instants n.

Conveniently, the grid voltage $V_G$ may be detected by suitable further sensor means (not shown), which may be of known type (e.g. voltage transformers, shunt resistors, or the like) and will not here further described for the sake of brevity.

According to the method 1, the acquired first data values $i_k(n)$ are subdivided in a sequence of time windows $TW_1, \ldots, TW_R$, which are defined so as to include a same number of sampling instants n, thereby having a same time width.

The time width of each time window $TW_1, \ldots, TW_R$ may be arranged according to the needs. As an example, each time window $TW_1, \ldots, TW_R$ may include P=200 sampling instants n, thereby having a time width of 0.02 s (sampling period Ts=100 µs).

Preferably, each time window $TW_1, \ldots, TW_R$ has a time width equal to the grid period of the grid sector 100 (e.g. equal to 0.02 s when the grid sector has a grid frequency of 50 Hz).

It has been seen that this solution remarkably simplifies the computational load to carry out the method of the invention as well as the definition of the time windows $TW_1, \ldots, TW_R$.

Figure 3:
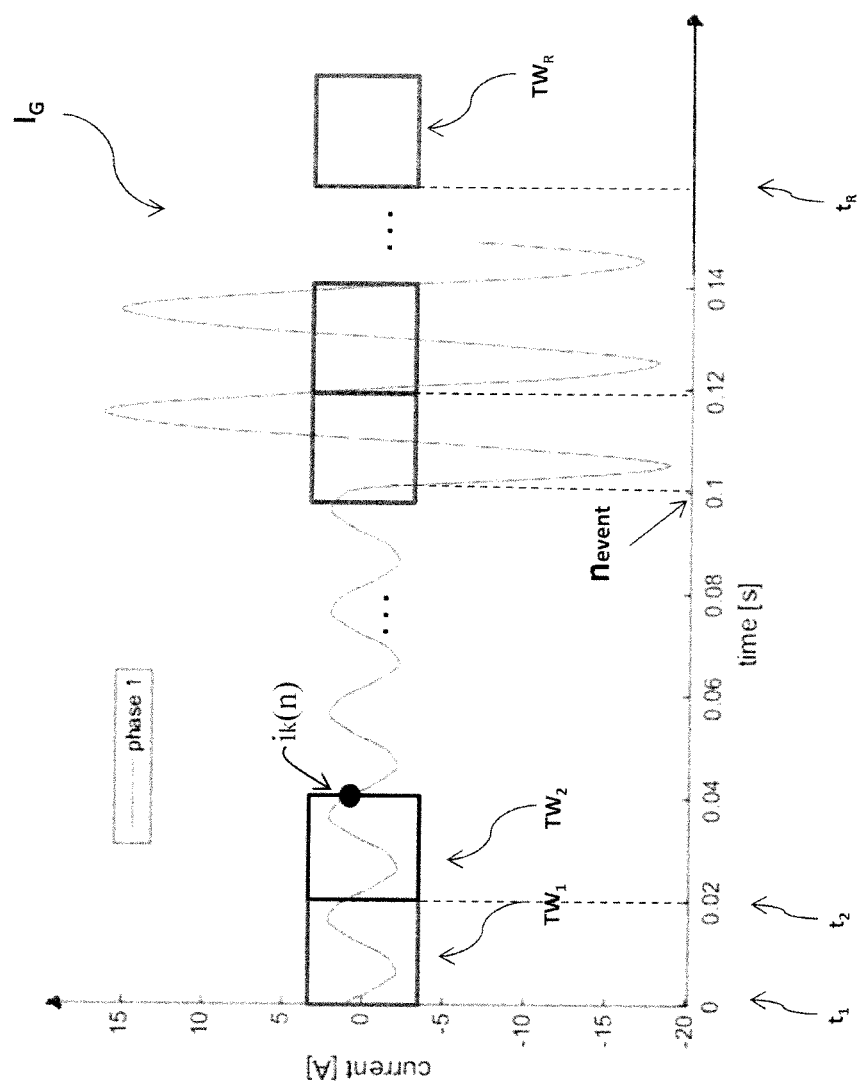

Referring to FIG. 3, the above mentioned sequence of time windows $TW_1, TW_R$ includes an initial time window $TW_1$ and one or more subsequent time windows $TW_2, \ldots, TW_R$, which follow the initial time window $TW_1$.

The time windows $TW_1, \ldots, TW_R$ are defined so as to start at corresponding start instants $t_1, t_2, \ldots, t_R$, which may be arranged according to the needs.

Preferably, the start instants $t_1, t_2, \ldots, t_R$ of the time windows $TW_1, \ldots, TW_R$ are equally spaced in time.

In FIG. 3, for the sake of clarity, an example is shown in which the subsequent time windows $TW_1, \ldots, TW_R$ are consecutively adjacent (in time) one to another, with each time window starting at the end instant of the preceding one.

Such an example corresponds to a theoretical case (represented in the cited figures for the sake of clarity only) in which the starting instants $t_1, t_2, \ldots, t_R$ of the time windows $TW_1, \ldots, TW_R$ are spaced by time intervals equal to the time width (e.g. 200 sampling instants n) of the time windows.

In practice, however, the starting instants $t_1, t_2, \ldots, t_R$ of the time windows $TW_1, \ldots, TW_R$ are spaced by time intervals including few sampling instants n only, thereby being spaced by few hundreds of µs in time. Obviously, in this case, each time window $TW_1, \ldots, TW_R$ will be partially overlapped with a number of subsequent time windows.

Figure 4:
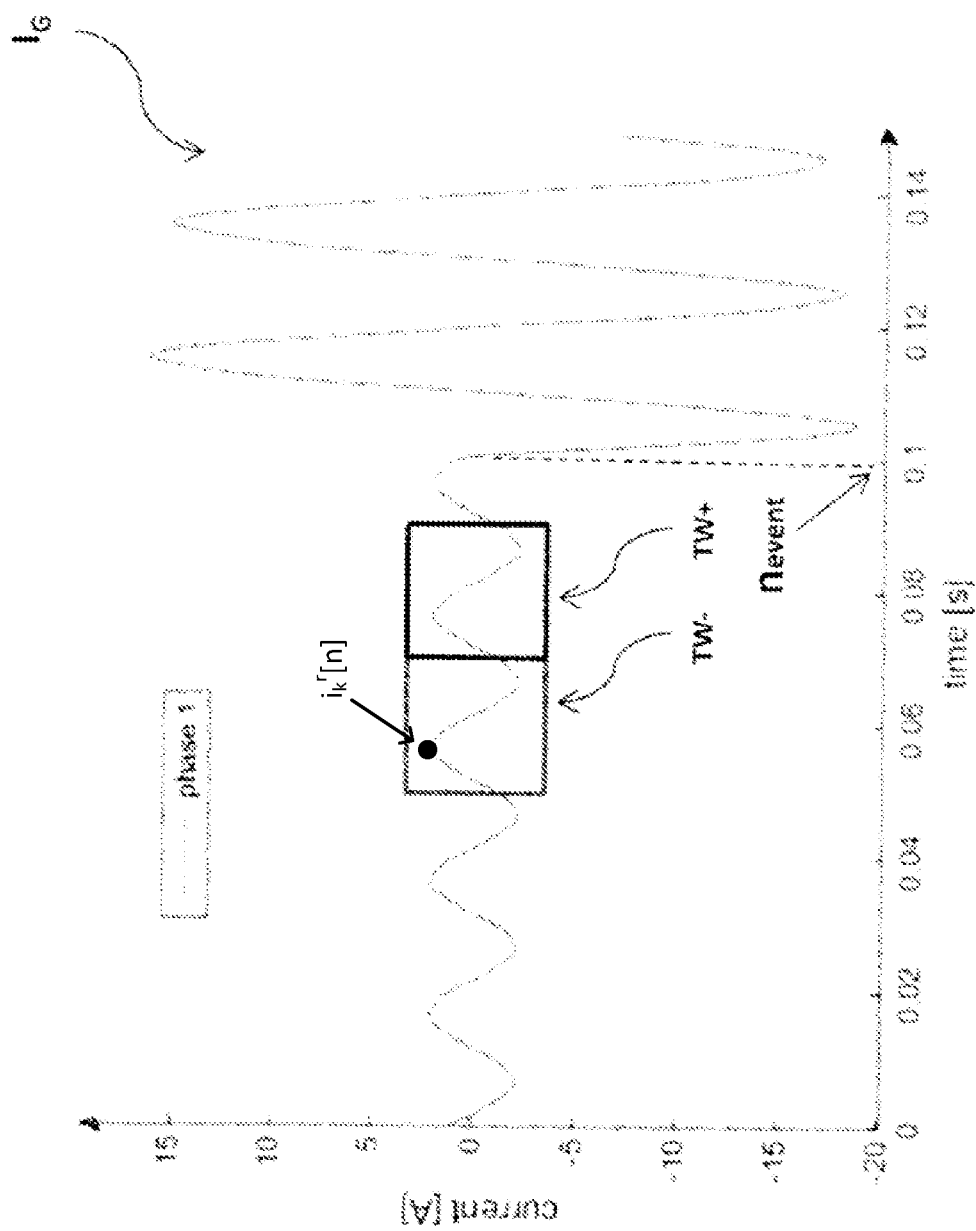
Figure 5:
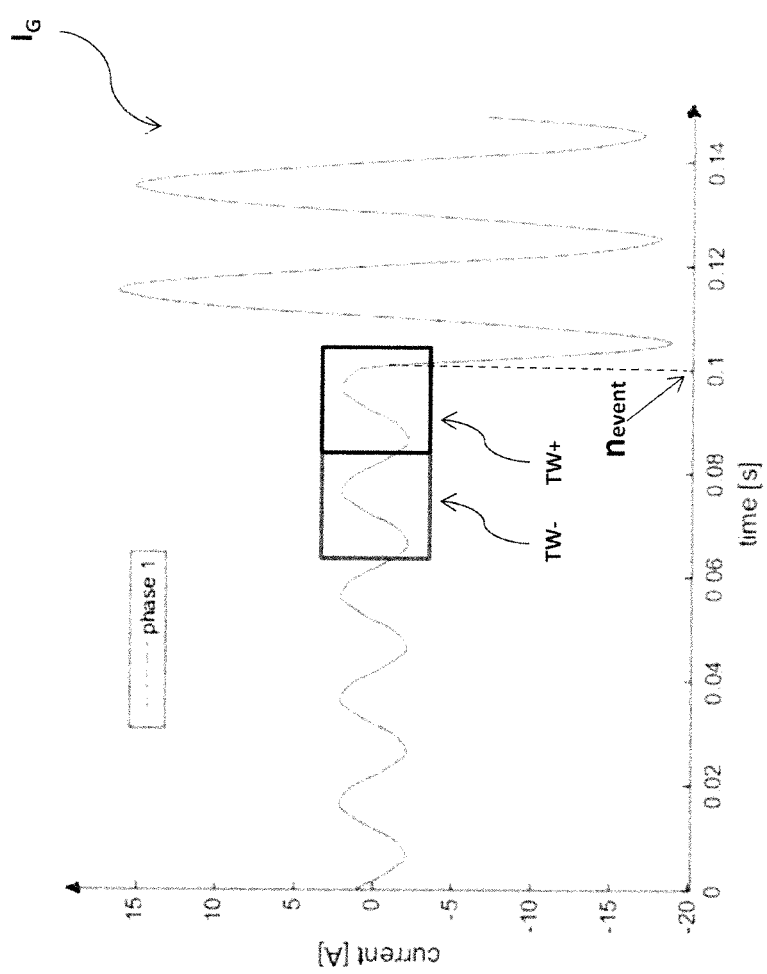

With reference to FIGS. 3-5, it is evident that the whole sequence of time windows $TW_1, \ldots, TW_R$ may be seen as a sequence of subsequent pairs of consecutive time windows $TW^-, TW^+$, each pair being formed by a given time window $TW^+$ and by a previous time window $TW^-$ preceding the time window $TW^+$.

As an example, the sequence of time windows $TW_1, TW_2, \ldots, TW_R$, can be defined by shifting in time the pairs of time windows $TW^-, TW^+$.

It is evident that, for a generic pair of time windows $TW_2, \ldots, TW_R$, the time window $TW^-$ may be the initial time window $TW_1$ or a time window included in the subsequent time windows $TW_2, \ldots, TW_R$ whereas the time window $TW^+$ may be a time window included in the subsequent time windows $TW_2, \ldots, TW_R$.

Upon the acquisition of the first data values $i_k(n)$, the method 1 processes first data values $i_k(n)$ acquired at one or more subsequent pairs of consecutive time windows $TW^-$, $TW^+$ to check whether the grid current $I_G$ is subject to anomalous variations from a time window to another.

More particularly, the method 1 comprises a step (b) of processing first data values $i_k^+[n]$ acquired at first sampling instants at least partially included in a time window $TW^+$ and first data values $i_k^-[n]$ acquired at second sampling instants, which precedes said first sampling instants and are at least partially included in a previous time window $TW^-$ preceding the time window $TW^+$.

The above-mentioned data values $i_k^-[n], i_k^+[n]$ are processed to check whether the grid current $I_G$, at the time window $TW^+$, is subject to an anomalous variation with respect to the previous time window $TW^-$.

In practice, as shown in FIGS. 4-5, for a generic sampling instant n included in a generic time window $TW^+$, first data values $i_k(n)$ at least partially acquired at the time window $TW^+$ and first data values $i_k^-[n]$ at least partially acquired at a previous time window $TW^-$ are processed to check whether the grid current $I_G$ is subject to an anomalous variation with respect to the previous time window $TW^-$.

More particularly, for a generic sampling instant n included in a generic time window $TW^+$, first data values $i_k(n)$ acquired at first sampling instants n at least partially included in the time window $TW^+$ and first data values $i_k(n)$ acquired at second sampling instants n, which precede said first sampling instants and are at least partially included in the preceding time window $TW^-$, are processed to calculate a statistical quantity $CH[n]$ indicative of the variation of the grid current $I_G$ at the time window $TW^+$ with respect to the previous time window $TW^-$. Such a statistical quantity is then compared with a threshold value to determine whether, at the time window $TW^+$, there is an anomalous variation of the detected grid current $I_G$.

Preferably, the step (b) of the method 1 comprises a sequence of sub-steps that is executed for one or more generic sampling instants n included in a generic time window $TW^+$.

Preferably, the step (b) of the method 1 comprises the following sub-steps for each electric phase of the grid sector 100:
- selecting a first vector $i_k^+[n]$ of first data values $i_k(n)$ acquired at first sampling instants n at least partially included in the time window $TW^+$;
- selecting a second vector $i_k^-[n]$ of first data values $i_k(n)$ acquired at second sampling instants n at least partially and preceding said first instants
- processing the selected vectors $i_k^+[n]$, $i_k^-[n]$ to calculate a phase current variation value $CH_k[n]$ indicative of a variation in a phase current of the grid current $I_G$ with respect the previous time window $TW^-$.

Conveniently, for each electric phase of the grid sector 100, the first vector $i_k^+[n]$ may be given by the following relation:

$$i_k^+[i_k(n-P+1), \ldots, i_k(n)]^T$$

where n is a generic sampling instant included in the time window $TW^+$, k is an electric phase index, P is the number of first data values $i_k(n)$ included in each time window.

Conveniently, for each electric phase of the grid sector 100, the second vector $i_k^-[n]$ may be given by the following relation:

$$i_k^-[n]=[i_k(n-2P+1), i_k(n-P)]^T$$

where n is a generic sampling instant included in the time window $TW^+$, k is an electric phase index, P is the number of first data values $i_k(n)$ included in each time window.

Conveniently, for each electric phase of the grid sector 100, the phase current variation value $CH_k[n]$ may be calculated as:

$$CH_k[n]=\|i_k^+[n]-i_k^-[n]\|$$

where n is a generic sampling instant included in the time window $TW^+$, k is an electric phase index.

In general, however, the phase current variation value $CH_k[n]$ is an index of variation of the grid current $I_G$ and it can be calculated as a sum of absolute values (as above indicated), or as a sum of squared differences, or as a weighted average with different values of weights, or as another function of sampled values. The choice of the method for calculating $CH_k[n]$ may depends on the actual type of the grid sector 100 (e.g. nominal absorbed power, type of the electric loads, etc.). Upon the calculation of the phase current variation value $CH_k[n]$ for each electric phase (for a generic sampling instant n) of the grid sector 100, the step (b) of the method 1 preferably comprises a further sub-step of processing the phase current variation values $CH_k[n]$, calculated for each electric phase, to calculate an overall current variation value $CH[n]$ indicative of an overall variation $\Delta I_G$ of the grid current $I_G$ with respect to the previous time window $TW^-$. Conveniently, the overall current variation value $CH[n]$ may be calculated as:

$$CH[n] = \sum_{k=1,\ldots} CH_k[n]$$

where n is a generic sampling instant included in the time window $TW^+$, k is an electric phase index and $CH_k[n]$ is the phase current variation value calculated for each electric phase of the grid sector 100.

Preferably, the step (b) of the method 1 comprises a further sub-step of comparing the overall current variation value $CH[n]$, so calculated at the generic instant n, with a first threshold value TH1.

Preferably, the step (b) of the method 1 comprises a further sub-step of repeating the above-described sub-steps for a first number N1 (for example N1=10) of sampling instants n included in the time window $TW^+$.

The first threshold value TH1 and the first number N1 may be set according to the actual nature of the electric loads $L_1, \ldots, L_M$.

Preferably, the step (b) of the method 1 comprises a further sub-step of checking whether the overall current variation value $CH[n]$ exceeds the first threshold value TH1 for at least the first number N1 of consecutive sampling instants n included in the time window $TW^+$.

If the overall current variation value $CH[n]$ does not exceed the first threshold value TH1 for a number N1 of consecutive sampling instants n, it is determined that the grid current $I_G$, at the time window $TW^+$, does not show any anomalous variation with respect to the previous time window $TW^-$. This means that no anomalous events occurred in the grid sector 100 at the time window $TW^+$ (FIG. 4).

If the overall current variation value $CH[n]$ exceeds the first threshold value TH1 for a number N1 of consecutive sampling instants (n), it is determined that the grid current $I_G$, at the time window $TW^+$, shows an anomalous variation with respect to the previous time window $TW^-$. This means that an anomalous event occurred in the grid sector 100 at an event instant $n_{event}$ included the time window $TW^+$ (FIG. 5).

It is noticed that the actual nature of said anomalous event is not identified at this stage of the method 1. However, the data processing carried out up to this stage, in particular the calculation of the statistical quantity $CH[n]$, allow understanding that an anomalous event is going on starting from the event instant $n_{event}$.

Figure 2:
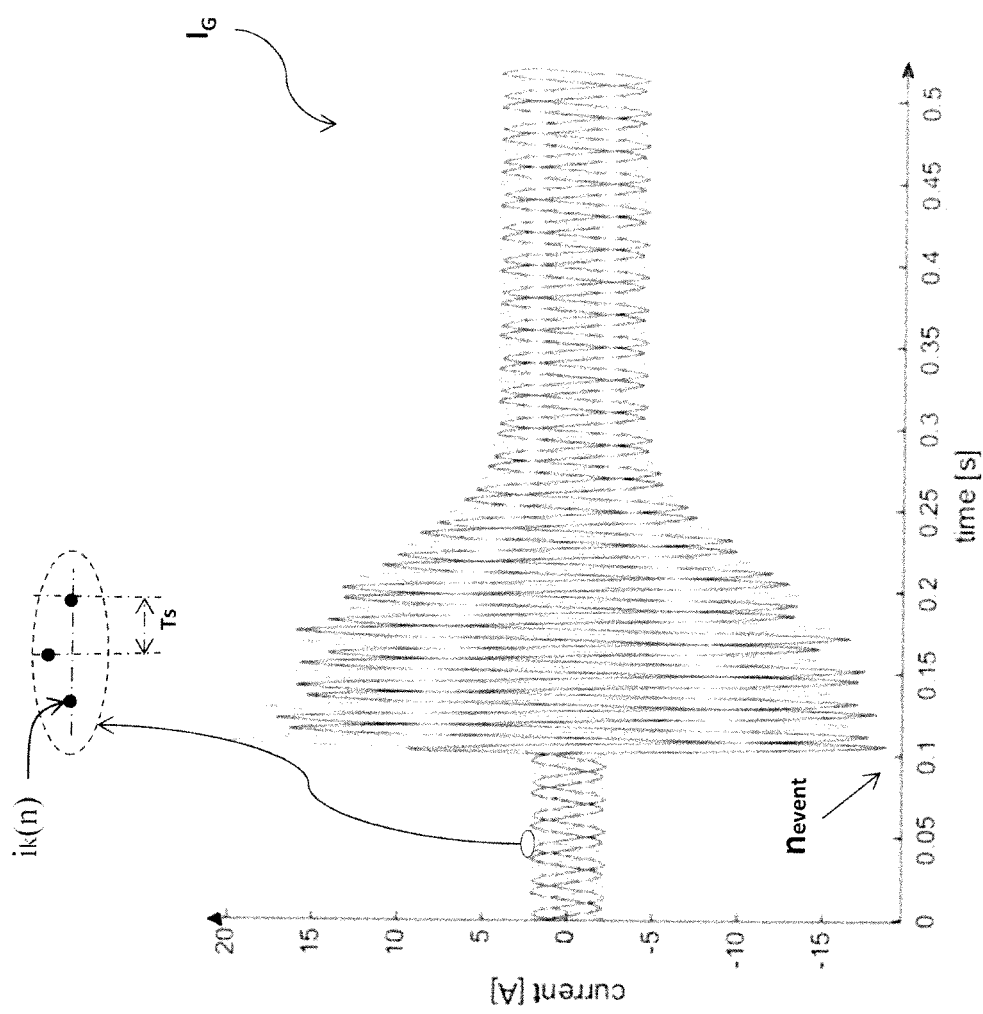
Figure 7:
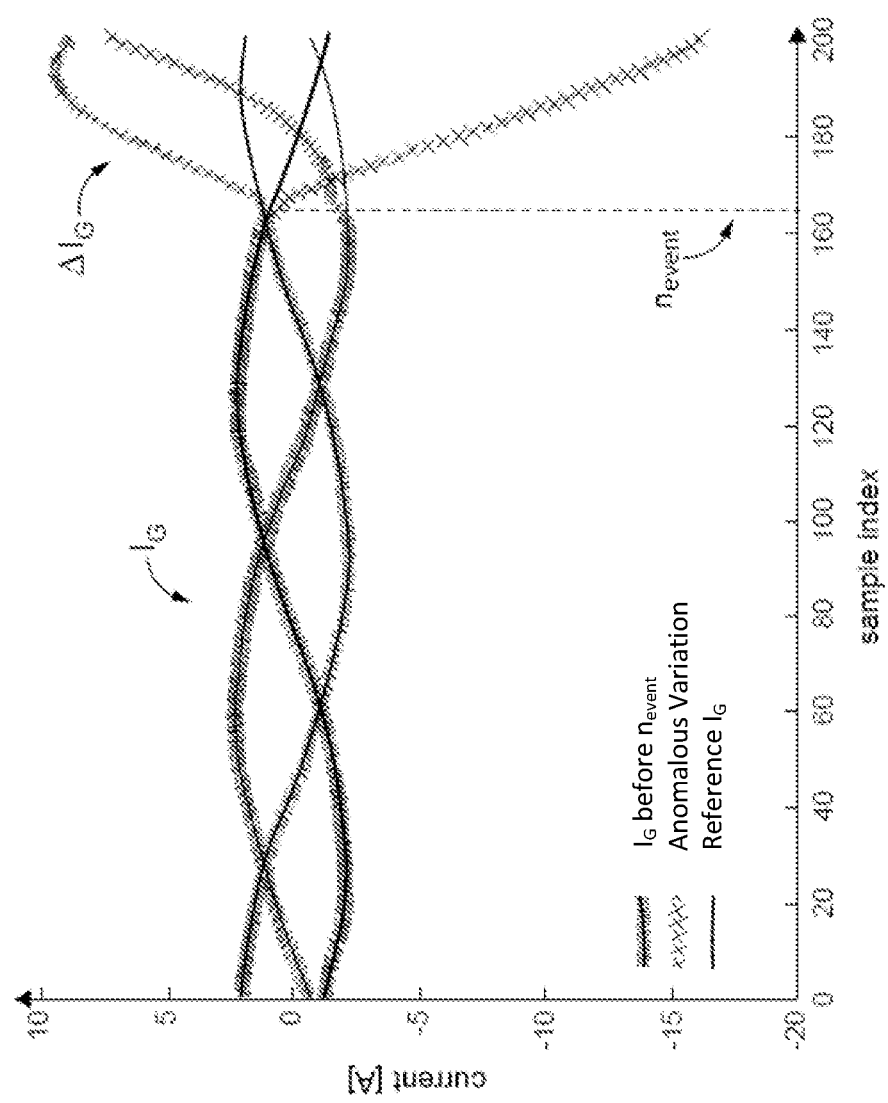

Referring to FIGS. 2 and 7, examples of the behaviour of the grid current $I_G$ detected at a coupling node PoC in a grid sector 100 including electric rotating machines as electric loads $L_1, \ldots, L_M$ are shown.

It is evident how the grid current $I_G$ shows an anomalous trend at an event instant $n_{event}$.

Figure 6:
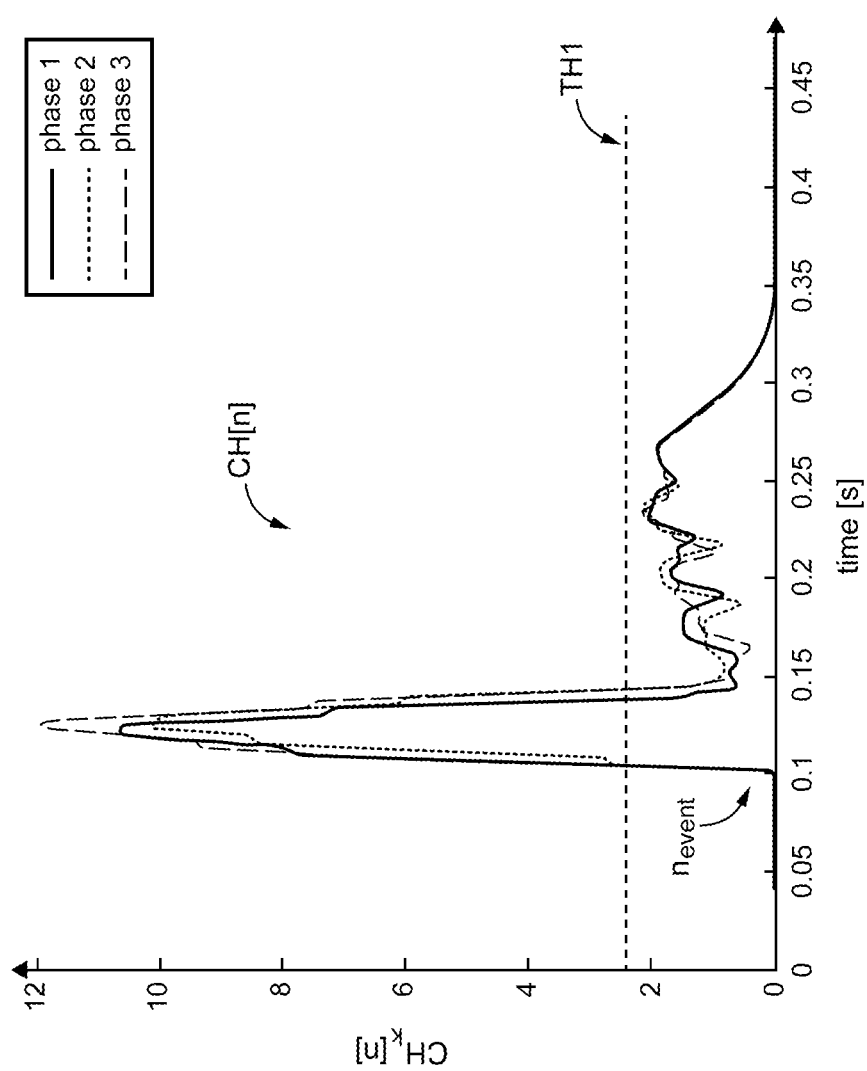

Referring to FIG. 6, corresponding examples of the phase current variation values $CH_k[n]$ calculated for each electric phase of the same grid sector 100 are shown.

As it is apparent, the calculated phase current variation values $CH_k[n]$ are subject to a sudden increase at the event instant $n_{event}$, when the grid current $I_G$ starts showing an anomalous trend.

The overall current variation value $CH[n]$ thus represents a reliable index to check whether the grid current $I_G$ is subject to an anomalous variation with respect to a normal background condition.

If it is determined that the grid current $I_G$, for the considered sampling instants n of the time window $TW^+$, is subject to no anomalous variations with respect to the previous time window $TW^-$, the method 1 comprises the step (c) of repeating the above-described step (b) for subsequent sampling instants n, which may still be included in the time window $TW^+$ or in a further time window of the subsequent time windows $TW_1, \ldots, TW_R$. In this last case, a subsequent pair of time windows $TW^-$, $TW^+$ will be taken into consideration for processing the acquired first values $i_k(n)$ for each electric phase.

If it is determined that the grid current $I_G$, starting from an event instant $n_{event}$ of the time window $TW^+$, is subject to an anomalous variation with respect to the previous time window $TW^-$, the method 1 comprises the step (d) of processing, for each electric phase of the grid sector 100, one or more first data values $i_k^e[n]$ acquired at sampling instants n following the event instant $n_{event}$ to calculate second data values $i_k^{clean}[n]$ indicative of the anomalous variation $\Delta I_G$ of the grid current $I_G$ (starting from said event instant $n_{event}$).

Conveniently, at the step (c), the method 1 provides for calculating the isolated current variation $\Delta I_G$ of the grid current $I_G$ caused by the anomalous event (not yet identified) occurred at the event instant $n_{event}$.

As will better emerge from the following, such isolated current variation $\Delta I_G$ represents a sort of "signature" of the above-mentioned anomalous event, which allows determining the typology of this latter.

Figure 8:
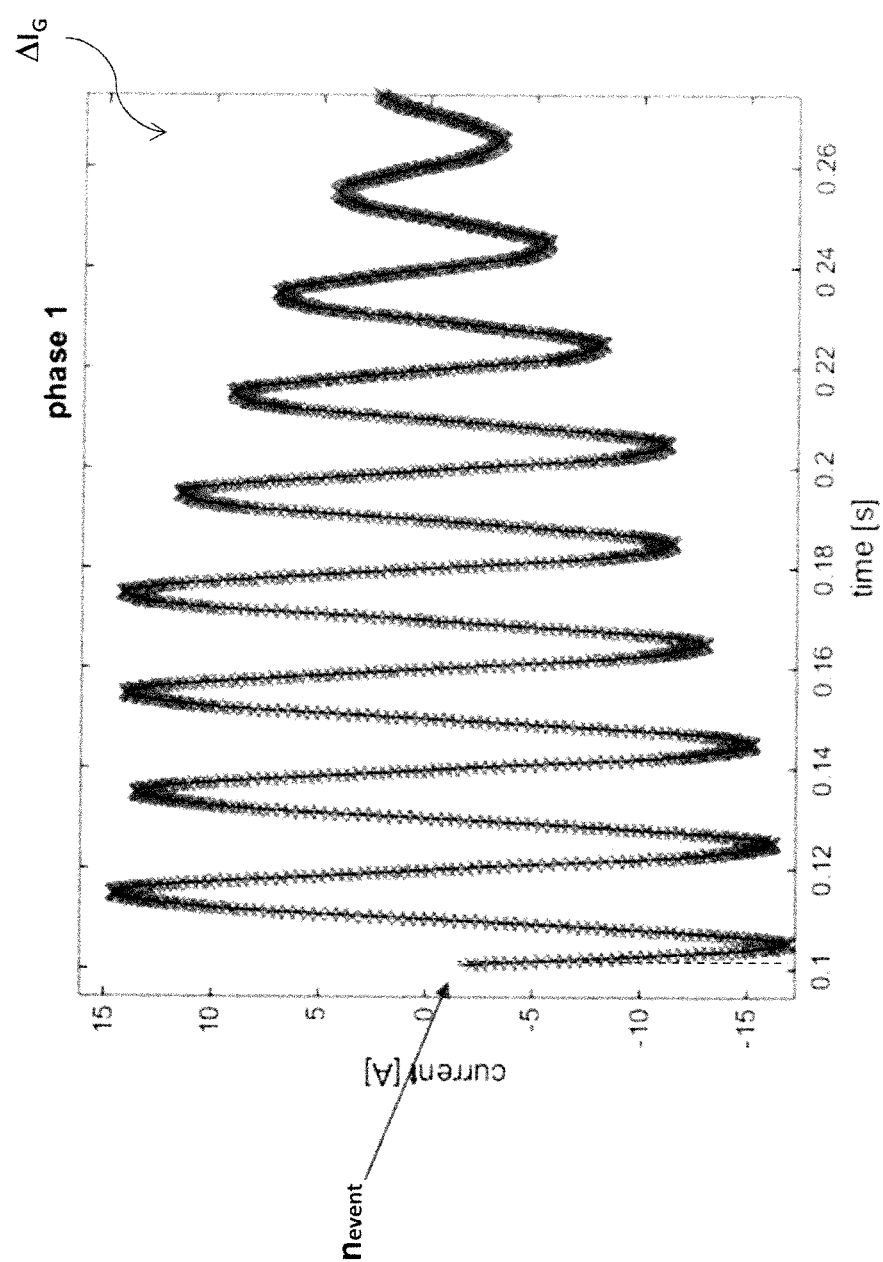

Referring to FIG. 8, it is shown an example of the behaviour of the isolated current variation $\Delta I_G$ at sampling instants n following the event instant $n_{event}$ for an electric phase of the grid current $I_G$ detected at a coupling node PoC in a grid sector 100 including electric rotating machines as electric loads $L_1, \ldots, L_M$.

In the illustrated example, the isolated current variation $\Delta I_G$ has the waveform of a typical in-rush current of an electric rotating machine. The isolated current variation $\Delta I_G$ may thus be indicative that the above-mentioned anomalous event consists in the start-up (transitional operating period) of an electric rotating machine of the grid sector 100.

Conveniently, the method (d) provides for calculating the isolated current variation $\Delta I_G$ of the grid current $I_G$ by suitably "cleaning" one or more first data values $i_k^e[n]$ acquired at sampling instants n following the event instant $n_{event}$.

Such a "cleaning" process of the first data values $i_k^e[n]$, acquired at sampling instants n of a time window following the event instant $n_{event}$, conveniently consists in subtracting one or more corresponding first reference data values $i_k^r[n]$ from said first data values.

The reference data values $i_k^r[n]$, which are preferably formed by one or more first data values acquired at sampling instants n preceding the event instant $n_{event}$, are indicative of a normal behaviour of the grid current $I_G$ occurring before the event instant $n_{event}$. They are thus indicative of a background condition of the grid current $I_G$ before the occurrence of the above-mentioned anomalous event.

Preferably, the step (d) of the method 1 comprises the sub-step of selecting, for each electric phase, a first data set $i_k^e[n]$ of first data values $i_k(n)$ acquired at one or more sampling instants following the event instant $n_{event}$.

Preferably, the step (d) of the method 1 comprises the step of selecting, for each electric phase of the grid sector 100, a second data set $i_k^r[n]$ of first reference data values indicative of a normal behaviour of said grid current $I_G$.

As mentioned above, the reference data values $i_k^r[n]$ conveniently comprise first data values $i_k(n)$ acquired at sampling instants n preceding said event instant $n_{event}$.

Preferably, the first reference data values $i_k^r[n]$ coincide with first data values included in the last time window $TW^-$ preceding the event instant $n_{event}$ as they truly represent the current background (see FIG. 4). In this case, the second data set $i_k^r[n]$ of first reference data values substantially can be created by repetition of the second vector $i_k^-[n]$ calculated at the step (b) of the method 1.

Preferably, the step (d) of the method 1 comprises the step of processing the first and second data sets $i_k^e[n]$, $i_k^r[n]$ to calculate a third data set $i_k^{clean}[n]$ of second data values indictive of the anomalous variation $\Delta I_G$ of the grid current $I_G$ (starting from said event instant $n_{event}$).

Conveniently, for each electric phase of the grid sector 100, the third data set $i_k^{clean}[n]$ of second data values may be given by the following relation:

$$i_k^{clean}[n] = i_k^e[n] - i_k^-[n]_{(n-n_{event}) \bmod P}$$

where n is a generic sampling instant of a time window following the event instant $n_{event}$, k is an electric phase index, P is the number of first data values $i_k(n)$ included in each time window, $i_k^-[n]_{(n-n_{event}) \bmod P}$ is the second vector $i_k^-[n]$ calculated at the step (b) of the method 1 at the last time window $TW^-$ preceding the event instant $n_{event}$ for step (d) of the method 1.

From the above relation, it is evident how each element of the third data set $i_k^{clean}[n]$ of second data values is calculated as a difference between corresponding first data values $i_k(n)$ included in a time window following the event instant $n_{event}$ and in the last time window $TW^-$ preceding the event instant $n_{event}$, respectively.

Upon the calculation of the second data values $i_k^{clean}[n]$ (for a generic sampling instant n), the method 1 comprises the step (e) of processing said second data values to check whether the anomalous variation $\Delta I_G$ of the grid current $I_G$ is due to a characteristic transitional operating period of an electric load $L_1, \ldots, L_M$.

In practice, the step (e) is directed to check whether the second data values $i_k^{clean}[n]$ match with second reference values indicative of the current absorbed by an electric load $L_1, \ldots, L_M$ during a specific transitional operating period of said electric load.

A matching between the second data values $i_k^{clean}[n]$ and the second reference values related to an electric load $L_1, \ldots, L_M$ will indicate that the anomalous variation $\Delta I_G$ of the grid current $I_G$ is due to the occurrence of such a characteristic transitional operating period for said electric load and not to an electric fault.

On the other hand, a mismatching between the second data values $i_k^{clean}[n]$ and the second reference values related to each electric load $L_1, \ldots, L_M$ will indicate that the anomalous variation of the grid current $I_G$ is due to the occurrence of an electric fault.

As an example, in a grid sector 100 including electric rotating machines as electric loads $L_1, \ldots, L_M$, an anomalous variation of the grid current $I_G$, starting from the event instant $n_{event}$, may be due to the high current (in-rush current) absorbed at the start-up of an electric rotating machine or to an electric fault.

A matching between the second data values $i_k^{clean}[n]$ and the second reference values describing the electric current absorbed by a specific electric rotating machine at the start-up phase (transitional operating period) will indicate that the identified anomalous variation $\Delta I_G$ of the grid current $I_G$ is due to the start-up of said electric rotating machine. In practice, this means that the anomalous event found at the step (b) of the method 1 is the start-up of said specific electric rotating machine.

Instead, if the second data values $i_k^{clean}[n]$ match with no second reference values describing the behaviour of the current absorbed by each electric rotating machine at the start-up phase, the identified anomalous variation $\Delta I_G$ of the grid current $I_G$ is due an electric fault. In practice, this means that the anomalous event found at the step (b) of the method 1 is an electric fault.

Preferably, the step (e) of the method 1 comprises a sub-step of processing the second data values $i_k^{clean}[n]$ calculated for each electric phase, at a sampling instant n subsequent to the event instant $n_{event}$, to calculate third data values $I^{clean}[n]$ indicative of the anomalous variation $\Delta I_G$ of the grid current $I_G$ (starting from said event instant $n_{event}$).

The data processing carried out in this sub-step of the step (e) actually depends on the actual nature of the electric loads $L_1, \ldots, L_M$.

As an example, when the grid sector includes electric rotating machines are electric loads $L_1, \ldots, L_M$, the third data values $I^{clean}[n]$ may be calculated by calculating the well-known Clark transformation of the second data values $i_k^{clean}[n]$ calculated for each electric phase and for a sampling instant n. In this case, the third data values $I^{clean}[n]$ may be indicative of the q-d waveform of the anomalous variation $\Delta I_G$ of the grid current $I_G$.

As a further example, the third data values may be calculated by calculating an estimate of impedances for each electric phase. The data values $I^{clean}[n]$ may then be indicative of the equivalent impedance seen by the circuit at sampling instant n.

Preferably, the step (e) of the method 1 comprises a sub-step of selecting, for each electric load $L_1, \ldots, L_M$, second reference data values $I^m[n]$ indicative, at a sampling instant n subsequent to the event instant $n_{event}$, of a predicted current absorbed by said $m^{th}$ electric load during a characteristic transitional operating period of said electric load.

In practice, for each electric load $L_1, \ldots, L_M$, a corresponding set of second reference data values $I^m[n]$, which describe the predicted behaviour for the current absorbed by said electric load when this latter is subject to a given characteristic transitional operating period.

As an example, when the grid sector 100 includes electric rotating machines as electric loads $L_1, \ldots, L_M$, a corresponding set of second reference data values $I^m[n]$ is selected for each electric rotating machine. Each set of second reference data values $I^m[n]$ describes the predicted behaviour for the current (in-rush current) absorbed by the corresponding electric rotating machine during the start-up phase (characteristic transitional period) of this latter. Conveniently, the second reference data values $I^m[n]$ may be indicative of the q-d waveform for the predicted current (in-rush current) absorbed by the corresponding electric rotating machine.

Preferably, the step (e) of the method 1 comprises a sub-step of processing, for each electric load $L_1, \ldots, L_M$, the corresponding third data values $I^{clean}[n]$ and the corresponding second reference data values $I^m[n]$ to calculate a corresponding error value $E^m[n]$ indicative of a difference, at an instant n subsequent to the event instant $n_{event}$, between the anomalous variation $\Delta I_G$ of said grid current $I_G$ and the predicted current absorbed by said electric load during said characteristic transitional operating period.

As an example, when the grid sector 100 includes electric rotating machines as electric loads $L_1, \ldots, L_M$, for each electric rotating machine, a corresponding error value $E[n]$ is calculated, which is indicative of the difference, at an instant n subsequent to the event instant $n_{event}$, between the anomalous variation $\Delta I_G$ (FIG. 8) of the grid current $I_G$ and the predicted current absorbed by said electric rotating machine during a start-up phase of this latter.

Conveniently, the error value $E^m[n]$ for a given electric load $L_1, \ldots, L_M$ may be calculated as:

$$E^m[n]=\|I^m[n]-I^{clean}[n]\|$$

where n is a sampling instant included in a time window following the event instant $n_{event}$, m is an electric load index.

$I^{clean}[n]$, $I^m[n]$ are vector values calculated by considering P consecutive instants of $I^{clean}[n]$ and $I^m[n]$, respectively, i.e. $I^{clean}[n]:=[I^{clean}[n], \ldots, I^{clean}[n-P+1]]^T$ and $I^m[n]:=[I^m[n], \ldots, I^m[n-P+1]]^T$, where P is the number of sampling instants n included in a generic time window.

Preferably, the step (e) of the method 1 comprises a sub-step of selecting a minimum error value $E^*[n]$ among the error values $E[n]$ calculated for all the electric loads $L_1, \ldots, L_M$.

In practice, the minimum error value $E^*[n]$ may be calculated as $E^*[n]:=\min E^m[n]$, where m is an electric load index.

Preferably, the step (e) of the method 1 comprises a sub-step of comparing said minimum error value $E^*[n]$ with a second threshold value TH2.

The second threshold value TH2 may be set according to the actual nature of the electric loads $L_1, \ldots, L_M$.

Preferably, the step (e) of the method 1 comprises a sub-step of repeating the above-described sub-steps for a second number N2 of sampling instants n following the event instant $n_{event}$.

The second number N2 of sampling instants can be conveniently selected depending on the response time desired for determining whether there is an electric fault in the grid sector 100.

Preferably, the step (e) of the method 1 comprises a sub-step of checking whether the minimum error value $E^*[n]$ exceeds the second threshold value TH2 for at least the second number N2 of sampling instants n.

If the minimum error value $E^*[n]$ does not exceed the second threshold value TH2 for at least the second number N2 of sampling instants n, the anomalous variation $\Delta I_G$ of the grid current $I_G$ is determined as due to the occurrence a transitional operating period of the electric load $L_1, \ldots, L_M$, which corresponds to the selected minimum error value $E^*[n]$.

As an example, when the grid sector 100 includes electric rotating machines as electric loads $L_1, \ldots, L_M$, for each electric rotating machine, if the minimum error value $E^*[n]$ does not exceed the second threshold value TH2 for at least the second number N2 of sampling instants n, the anomalous variation $\Delta I_G$ (FIG. 8) of the grid current $I_G$ is determined as due to the occurrence a start-up of the electric rotating machine $L_1, \ldots, L_M$ for which to the selected minimum error value $E^*[n]$ has been calculated.

In fact, in this case, there is an acceptable matching between the calculated second data values $i_k^{clean}[n]$ with the specific reference values taken into consideration for an electric load of the grid sector 100.

Figure 9:
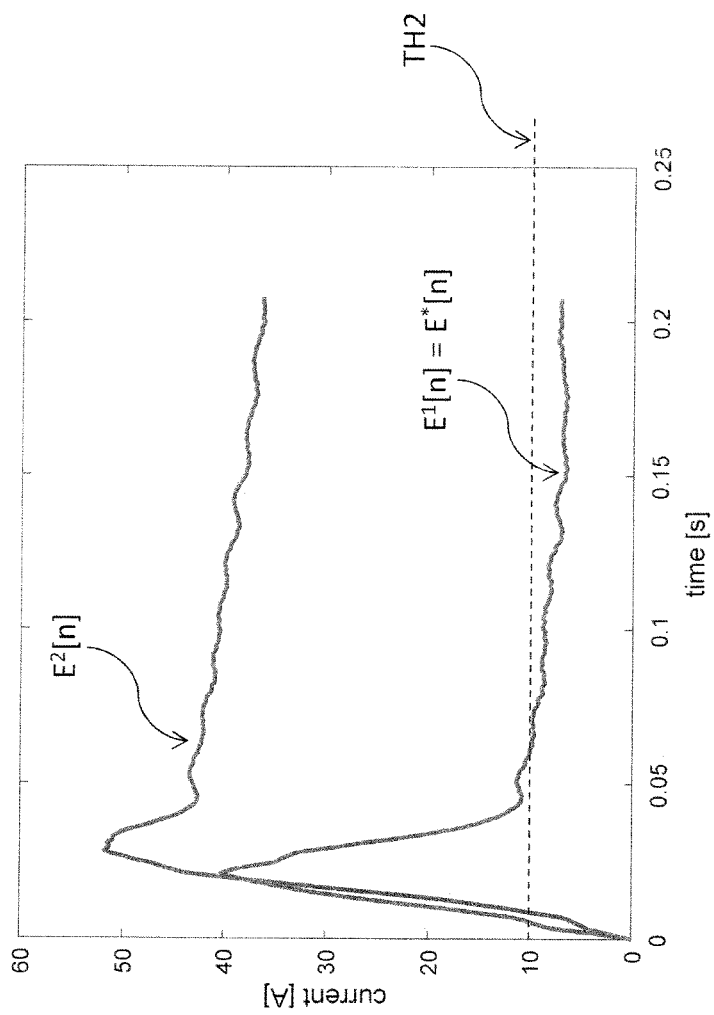
Figure 10:
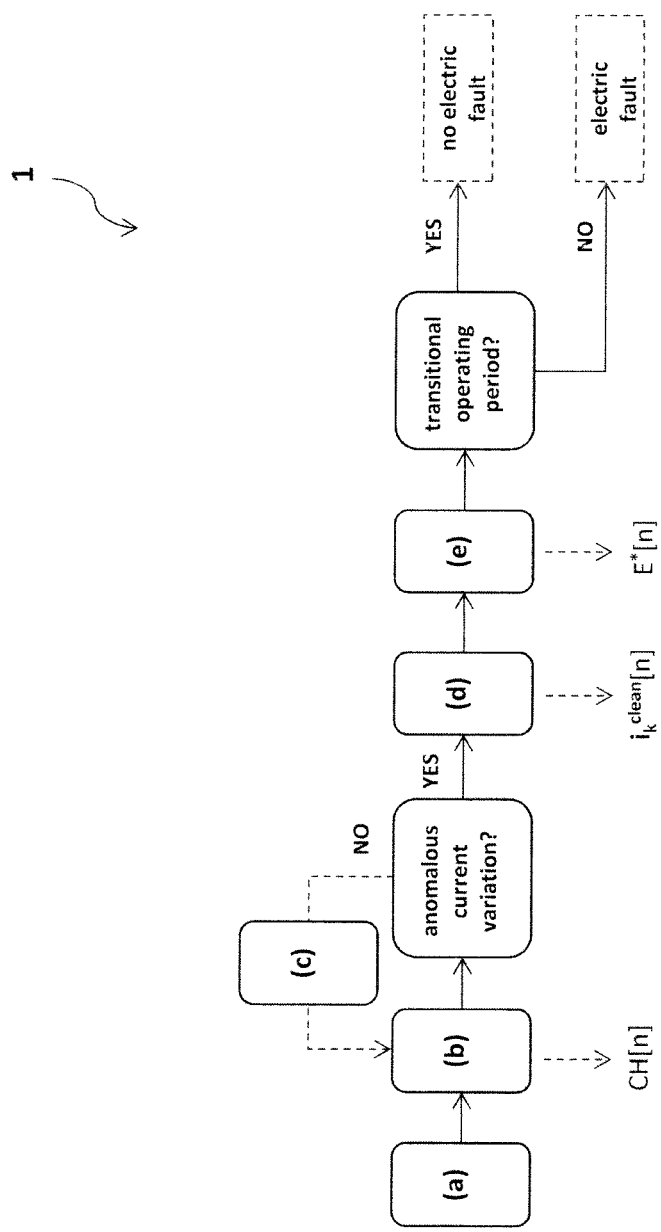

FIG. 9 refers to the operation of an exemplary grid sector including two electric rotating machines $L_1, L_2$ as electric loads. The behaviour of the error values $E^1[n]$, $E^2[n]$ calculated for two electric rotating machines A, B is schematically shown. As evidenced, the error value $E^1[n]$ can be selected as minimum error value $E^*[n]$.

Since $E^1[n]$ is lower than the selected second threshold value TH2 for a long time interval, the anomalous variation $\Delta I_G$ (FIG. 8) of the grid current $I_G$ is likely due to the in-rush current absorbed by the electric rotating machine $L_1$ at the start-up of this latter.

If the minimum error value $E^*[n]$ does not exceed the second threshold value TH2 for at least the second number N2 of sampling instants n, the anomalous variation $\Delta I_G$ (FIG. 8) of the grid current $I_G$ is determined as due to an electric fault.

In fact, in this case, there is no matching between the calculated second data values $i_k^{clean}[n]$ with the specific reference values taken into consideration for each electric load of the grid sector 100. It is interesting to notice that the anomalous variation $\Delta I_G$ of the grid current $I_G$ may be caused by to the occurrence transitional operating periods for a plurality of the electric loads $L_1, \ldots, L_M$.

As an example, when the grid sector 100 includes electric rotating machines as electric loads $L_1, \ldots, L_M$, this situation may occur when a plurality of electric rotating machines are activated at a same time.

According to the method 1, this particular condition is considered as equivalent to an electric fault as it will be almost impossible to find a matching between the second data values $i_k^{clean}[n]$ and the specific second reference values $I^m[n]$ related to each electric load $L_1, \ldots, L_M$.

This approach, however, does not provide any real disadvantage as the above-mentioned particular condition is not frequent in the real operating life of an electric power distribution grid.

If it is determined that the anomalous variation $\Delta I_G$ of the grid current $I_G$ is due to the occurrence a transitional operating period of one of the electric loads $L_1, \ldots, L_M$, suitable control strategies (e.g. load shedding strategies) to manage the electric loads of the grid sector 100 may be carried out without activating the switching device $S_1$ to disconnect the grid sector 100 from the electric power source 200.

As an example some electric loads of the grid sector may be disconnected or regulated so as to compensate the anomalous variation $\Delta I_G$ of grid current $I_G$ adsorbed by the grid sector 100 as a consequence of the occurrence of a transitional operating period of an electric load as it is possible to be confident that the grid current $I_G$ will decrease soon.

However, in order to increase the protection level, it is possible to activate the switching device $S_1$ to disconnect the grid sector 100 and provide an operator with information that the activation of the switch $S_1$ was due to a transitional operating period of an electric loads Lm. In such a case, the operator will know that one way for preventing successive downtime is to install a current limiting device at the electric load $L_m$, such a driver or a soft-starter.

Further examples of such control techniques are described in EP16202531.6 in the name of the same applicant.

If it is determined that the anomalous variation $\Delta I_G$ of the grid current $I_G$ is due to an electric fault, suitable control signals C1 may be generated to prompt the switching device $S_1$ to disconnect the grid sector 100 from the electric power source 200.

In general, the second reference data values may be calculated on the base of first data samples indicative $i_k(n)$ of the grid current $I_G$ and, possibly, on the base of further data samples $v_k(n)$ indicative of the grid voltage $V_G$, when available.

According to a preferred embodiment of the invention, the second reference data values $I^m[n]$ are calculated by simulating the behaviour of each electric load $L_1, \ldots, L_M$ using a time-discrete model describing the operation of said electric load during the corresponding characteristic transitional operating period.

Conveniently, the second reference data values $I^m[n]$ for a given electric load $L_1, \ldots, L_M$ may be given by the following relation:

$$I^m[n]=Y(p_m, V[n])$$

where $p_m$ is a set of electrical and mechanical parameters estimated for said $m^{th}$ electric load and $V[n])$ is a set of detection data indicative of the operating voltage of said electric load during said characteristic transitional operating period.

The function $Y(\ )$, which expresses the above mentioned time-discrete model, may be of known type and is conveniently calculated depending on the actual nature of the electric loads $L_1, \ldots, L_M$. For example, when the grid sector 100 includes electric rotating machines as electric loads $L_1, \ldots, L_M$, the function $Y(\ )$ may be calculated according to the well-known modelling techniques described in the following scientific papers:

P. C. Krause et al. "Analysis of electric machinery and drive systems", John Wiley and Sons, 2013;

C. M. Ong "Dynamic Simulation of Electric Machinery: using Matlab/Simulink", Prentice Hall, N.J., 1998.

Preferably, the above-mentioned time-discrete model is calculated by carrying out a modelling procedure for each electric load $L_1, \ldots, L_M$ of the grid sector 100.

Preferably, such a modelling procedure comprises the following steps:

activating an electric load Lm of the grid sector 100;

deactivating the remaining electric loads of the grid sector 100;

for each electric phase, acquiring detection data indicative of the operating voltage of the electric load Lm and of the current absorbed by the electric load Lm during a characteristic transitional operating period of the electric load Lm;

processing said detection data to estimate one or more actual electrical and/or mechanical parameters $p_{est}$ of the electric load Lm;

repeating the steps above for each electric load $L_1, \ldots, L_M$ of the grid sector 100.

Conveniently, the actual electrical and mechanical parameters $p_{est}$ of the electric load Lm are estimated by solving a non linear least square (NLS) problem based on installation constraints provided for the electric load Lm.

As an example, when the grid sector 100 includes electric rotating machines as electric loads $L_1, \ldots, L_M$, for each electric rotating machine, the above-described set-up procedure may include the following steps:

activating an electric rotating machine Lm of the grid sector 100;

deactivating the remaining electric rotating machines of the grid sector 100;

for each electric phase, acquiring detection data indicative of the operating voltage of the electric rotating machine Lm and of the current absorbed by the electric rotating machine Li during the start-up of the electric rotating machine Lm;

processing said detection data to estimate one or more actual electrical and/or mechanical parameters $p_{est}$ of the electric rotating machine Lm.

The actual electrical and/or mechanical parameters $p_{est}$ of the electric rotating machine Lm may be calculated by solving a NLS problem given by the following relation:

$$p_{est}=\arg\min \text{tr} ((I_{qd}-Y(p, V_{qd}) (I_{qd}Y(p, V_{qd})^T), p \in \Pi$$

wherein Π is a set of a possible electric and mechanical parameters for the electric rotating machine Lm based on prior information (e.g. resistances, reactances, and the like, $I_{qd}$ are the q-d values for the detected current absorbed by the electric rotating machine Lm (e.g. calculated by processing the detected current values means through a Clark transformation of) and $V_{qd}$ are the q-d values (e.g. calculated by processing the detected voltage values through a Clark transformation).

Examples of NLS methods and estimation methods of electrical and/or mechanical parameters of an electric rotating machine are described in the following scientific paper:

Shaw, Steven R., and Steven B. Leeb. "Identification of induction motor parameters from transient stator current measurements." IEEE Transactions on Industrial Electronics 46.1 (1999): 139-149.

The above-described modelling procedure is conveniently carried out during a commissioning phase of the grid sector 100. However, it may be conveniently carried out during a maintenance procedure to update the above-mentioned time-discrete model for each electric load $L_1, \ldots, L_M$ during the operating life of this latter.

As it can be easily understood from the above, the method, according to the invention, is characterised by a high flexibility in use and it can be easily adapted to different typologies of electric loads having specific transitional periods.

As mentioned above, the method 1 is particularly suitable for the identification of a fault event in a grid sector 100 including electric rotating machines as electric loads $L_1, \ldots, L_M$.

In this last case, the method 1 can be easily adapted to the implementation in grid sectors having groups of electric rotating machine $L_1, \ldots, L_M$ as electric loads.

The method 1, according to the invention, is particularly suitable for being implemented by a computerised device 300.

In a further aspect, the present invention relates to a computer program 350 comprising software instructions to carry out the method, according to the invention.

The computer program 350 is stored or storable in a storage medium, e.g. in a memory of the computerised device 300 (FIG. 1).

In a further aspect, the present invention further relates to a computerised device 300 comprising computerised resources (e.g. one or more microprocessors) configured to execute software instructions to carry out the method, according to the invention.

Conveniently, the sensor means 301 may arranged to provide the first detection signals D1 to the computerised device 300 configured to carry out the sampling of said detection signals and implement the method 1.

According to possible embodiments of the invention, the computerised device 300 may be an electronic protection device (electronic protection relay) for an electric power distribution grid, which, as an example, may be installed on board the switching device $S_1$ or operatively associated to the switching device $S_1$.

According to possible embodiments of the invention, the computerised device 300 may be also a controller for an electric power distribution grid installed on the field or positioned at a remote location with respect to the grid sector 100.

The method, according to the present invention, is quite effective in identifying an electric fault in a grid sector 100 of an electric power distribution grid.

In particular, the method 1 allows determining whether an anomalous variation of the grid current $I_G$ is due to an electric fault or due to a transitional operating period of an electric load.

In this last case, the method 1 allows identifying which electric load is subject to a transitional operating period, thereby providing relevant information for the implementation of suitable control strategies for managing the electric loads of the grid sector 100 without disconnecting this latter. The above-described capabilities of the method 1 ensures a robust and reliable control of the operation of the grid sector and, at the same time, allows avoiding or reducing unnecessary disconnection interventions of the electric loads.

The method, according to the present invention, is particularly adapted to be implemented using the hardware and software resources that are already installed on the field to manage the operational of the electric power distribution grid.

The method, according to the invention, is particularly adapted for being implemented in digitally enabled power distribution networks (smart grids, micro-grids and the like).

The method, according to the invention, is of relatively easy and cost-effective practical implementation on the field.

The method is well scalable for various type of electrical grids (industrial, commercial, and residential) and electrical load types, e.g. rotating machines, such as induction machines, synchronous machines, direct current machines, or other type of electrical loads, such as cooling and heating equipment, furnaces, to name a few.

The invention claimed is:

1. A method for identifying a fault event in an electric power distribution grid sector, said grid sector including one or more electric loads and having a coupling node with a main grid, at which a grid current of said grid sector is detectable, said method comprising:

acquiring, for each electric phase, first data values indicative of said grid current, said first data values being acquired at subsequent sampling instants subdivided in a sequence of time windows;

processing a first portion of said first data values acquired, for each electric phase, at first sampling instants at least partially included in a time window and a second portion of said first data values acquired, for each electric phase, at second sampling instants preceding said first sampling instants and at least partially included in a previous time window preceding said time window to check whether said grid current, at said time window, is subject to an anomalous variation with respect to said previous time window;

if it is determined that said grid current is not subject to an anomalous variation with respect to said previous time window, repeating said processing said first portion of said first data values for subsequent sampling instants;

if it is determined that said grid current, starting from an event instant of said time window, is subject to an anomalous variation with respect to said previous time window, processing a third portion of one or more of said first data values acquired, for each electric phase, at sampling instants following said event instant to calculate, for each electric phase, second data values indicative of the anomalous variation of said grid current;

processing said second data values calculated for each electric phase to check whether the anomalous variation of said grid current is due to a characteristic transitional operating period of an electric load of said grid sector;

processing said second data values calculated for each electric phase to calculate third data values indicative of the anomalous variation of said grid current;

for each electric load, selecting second reference data values indicative of a predicted current absorbed by said electric load during a characteristic transitional operating period of said electric load;

for each electric load, processing said third data values and said second reference data values to calculate an error value indicative of a difference between the anomalous variation of said grid current and the predicted current absorbed by said electric load during said characteristic transitional operating period;

selecting a minimum error value among the error values calculated for said electric loads;

comparing said minimum error value with a second threshold value;

repeating the previous steps for a second number of sampling instants following said event instant; and checking whether said minimum error value exceeds said second threshold value for said second number of sampling instants.

2. The method, according to claim 1, wherein said processing said first portion of said first data values further comprises the following:

for each electric phase of said grid sector, executing the following steps:

selecting a first vector of said first portion of said first data values acquired at said first sampling instants;

selecting a second vector of said second portion of said first data values acquired at said second sampling instants;

processing said first and second vectors to calculate a phase current variation value indicative of a variation in a phase current of said grid current with respect to said previous time window;

processing the phase current variation values calculated for each electric phase to calculate an overall current variation value indicative of an overall variation of said grid current with respect to said previous time window;

comparing said overall current variation value with a first threshold value;

repeating the previous steps for a first number of sampling instants included in said time window; and checking whether said overall current variation value exceeds said first threshold value for said first number of sampling instants.

3. The method, according to claim 1, wherein said starting from said event instant of said time window comprises the following:

for each electric phase, selecting a first data set of said third portion of said first data values acquired at sampling instants following said event instant;

selecting a second data set of first reference data values indicative of a background condition of said grid current; and processing said first and second data sets of data values to calculate a third data set of said second data values.

4. The method, according to claim 3, wherein said reference data values are a fourth portion of said first data values acquired at one or more sampling instants preceding said event instant.

5. The method, according to claim 4, wherein said reference data values are a fourth portion of said first data values acquired at the previous time window preceding said event instant.

6. The method, according to claim 1, wherein said second reference data values are calculated by simulating behavior of each electric load using a time-discrete model describing the operation of said electric load during said characteristic transitional operating period.

7. The method, according to claim 6, wherein said time-discrete model is calculated by performing a modelling procedure that comprises the following steps:

activating an electric load of said one or more electric loads of said grid sector;

deactivating remaining electric loads of said one or more electric loads of said grid sector;

acquiring detection data indicative of an operating voltage and of a predicted current of said electric load during said characteristic transitional operating period of said electric load; and processing said detection data to estimate one or more actual electrical and/or mechanical parameters of said electric load to be used in said time-discrete model.

8. The method, according to claim 7, wherein said actual electrical and mechanical parameters of said electric load are estimated by solving a non-linear least squares (NLS) problem based on one or more installation constraints provided for said electric load.

9. The method, according to claim 1, wherein said electric loads are formed by electric rotating machines or groups of electric rotating machines, the characteristic transitional operating period of said electric loads being a start-up phase of said electric rotating machines or groups of electric rotating machines.

10. A non-transitory computer readable medium containing computer instructions stored therein for causing a computer processor to:

acquire, for each electric phase, first data values indicative of a grid current, said first data values being acquired at subsequent sampling instants subdivided in a sequence of time windows;

process a first portion of said first data values acquired, for each electric phase, at first sampling instants at least partially included in a time window and a second portion of said first data values acquired, for each electric phase, at second sampling instants preceding said first sampling instants and at least partially included in a previous time window preceding said time window to check whether said grid current, at said time window, is subject to an anomalous variation with respect to said previous time window;

if it is determined that said grid current is not subject to an anomalous variation with respect to said previous time window, repeat said processing said first portion of said first data values for subsequent sampling instants;

if it is determined that said grid current, starting from an event instant of said time window, is subject to an anomalous variation with respect to said previous time window, process a third portion of one or more of said first data values acquired, for each electric phase, at sampling instants following said event instant to calculate, for each electric phase, second data values indicative of the anomalous variation of said grid current;

process said second data values calculated for each electric phase to check whether the anomalous variation of said grid current is due to a characteristic transitional operating period of an electric load of a grid sector of a main grid;

process said second data values calculated for each electric phase to calculate third data values indicative of the anomalous variation of said grid current;

for each electric load, select second reference data values indicative of a predicted current absorbed by said electric load during a characteristic transitional operating period of said electric load;

for each electric load, process said third data values and said second reference data values to calculate an error value indicative of a difference between the anomalous variation of said grid current and the predicted current absorbed by said electric load during said characteristic transitional operating period;

select a minimum error value among the error values calculated for said electric loads;

compare said minimum error value with a second threshold value;

repeat the previous steps for a second number of sampling instants following said event instant; and check whether said minimum error value exceeds said second threshold value for said second number of sampling instants.

11. A computerized device for operating a switching device comprising:

a processor; and a memory device including instructions configured to be executable by the processor effective to:

acquire, for each electric phase, first data values indicative of a grid current, said first data values being acquired at subsequent sampling instants subdivided in a sequence of time windows;

process a first portion of said first data values acquired, for each electric phase, at first sampling instants at least partially included in a time window and a second portion of said first data values acquired, for each electric phase, at second sampling instants preceding said first sampling instants and at least partially included in a previous time window preceding said time window to check whether said grid current, at said time window, is subject to an anomalous variation with respect to said previous time window;

if it is determined that said grid current is not subject to an anomalous variation with respect to said previous time window, repeat said processing said first portion of said first data values for subsequent sampling instants;

if it is determined that said grid current, starting from an event instant of said time window, is subject to an anomalous variation with respect to said previous time window, process a third portion of one or more of said first data values acquired, for each electric phase, at sampling instants following said event instant to calculate, for each electric phase, second data values indicative of the anomalous variation of said grid current;

process said second data values calculated for each electric phase to check whether the anomalous variation of said grid current is due to a characteristic transitional operating period of an electric load of a grid sector of a main grid;

process said second data values calculated for each electric phase to calculate third data values indicative of the anomalous variation of said grid current;

for each electric load, select second reference data values indicative of a predicted current absorbed by said electric load during a characteristic transitional operating period of said electric load;

for each electric load, process said third data values and said second reference data values to calculate an error value indicative of a difference between the anomalous variation of said grid current and the predicted current absorbed by said electric load during said characteristic transitional operating period;

select a minimum error value among the error values calculated for said electric loads;

compare said minimum error value with a second threshold value;

repeat the previous steps for a second number of sampling instants following said event instant; and check whether said minimum error value exceeds said second threshold value for said second number of sampling instants.

12. An electronic protection system comprising:

a switching device;

a processor; and a memory device including instructions configured to be executable by the processor effective to:

acquire, for each electric phase, first data values indicative of a grid current, said first data values being acquired at subsequent sampling instants subdivided in a sequence of time windows;

process a first portion of said first data values acquired, for each electric phase, at first sampling instants at least partially included in a time window and a second portion of said first data values acquired, for each electric phase, at second sampling instants preceding said first sampling instants and at least partially included in a previous time window preceding said time window to check whether said grid current, at said time window, is subject to an anomalous variation with respect to said previous time window;

if it is determined that said grid current is not subject to an anomalous variation with respect to said previous time window, repeat said processing said first portion of said first data values for subsequent sampling instants;

if it is determined that said grid current, starting from an event instant of said time window, is subject to an anomalous variation with respect to said previous time window, process a third portion of one or more of said first data values acquired, for each electric phase, at sampling instants following said event instant to calculate, for each electric phase, second data values indicative of the anomalous variation of said grid current;

process said second data values calculated for each electric phase to check whether the anomalous variation of said grid current is due to a characteristic transitional operating period of an electric load of a grid sector of a main grid;

process said second data values calculated for each electric phase to calculate third data values indicative of the anomalous variation of said grid current;

for each electric load, select second reference data values indicative of a predicted current absorbed by said electric load during a characteristic transitional operating period of said electric load;

for each electric load, process said third data values and said second reference data values to calculate an error value indicative of a difference between the anomalous variation of said grid current and the predicted current absorbed by said electric load during said characteristic transitional operating period;

select a minimum error value among the error values calculated for said electric loads;

compare said minimum error value with a second threshold value;

repeat the previous steps for a second number of sampling instants following said event instant; and check whether said minimum error value exceeds said second threshold value for said second number of sampling instants.

13. The computerized device, according to claim 11, wherein the computerized device is a controller for an electric power distribution grid.

14. The method, according to claim 2, wherein said starting from said event instant of said time window comprises the following:

for each electric phase:
    selecting a first data set of said third portion of said first data values acquired at sampling instants following said event instant;
    selecting a second data set of first reference data values indicative of a background condition of said grid current; and
    processing said first and second data sets of data values to calculate a third data set of said second data values.

15. The method, according to claim 14, wherein said reference data values are a fourth portion of said first data values acquired at one or more sampling instants preceding said event instant.

16. The method, according to claim 15, wherein said reference data values are a fourth portion of said first data values acquired at the previous time window preceding said event instant.

17. The method, according to claim 2, wherein said electric loads are formed by electric rotating machines or groups of electric rotating machines, the characteristic transitional operating period of said electric loads being a start-up phase of said electric rotating machines or groups of electric rotating machines.

* * * * *